(12) United States Patent
Chen et al.

(10) Patent No.: US 8,917,109 B2
(45) Date of Patent: Dec. 23, 2014

(54) METHOD AND DEVICE FOR PULSE WIDTH ESTIMATION

(71) Applicant: United Microelectronics Corporation, Hsinchu (TW)

(72) Inventors: Shi-Wen Chen, Kaohsiung (TW); Yung-Hsiang Lin, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 157 days.

(21) Appl. No.: 13/855,708

(22) Filed: Apr. 3, 2013

(65) Prior Publication Data

US 2014/0300385 A1     Oct. 9, 2014

(51) Int. Cl.
  *G01R 31/02*   (2006.01)
  *G01R 31/26*   (2014.01)
  *G01R 29/02*   (2006.01)
  *G01R 31/28*   (2006.01)

(52) U.S. Cl.
  CPC .......... *G01R 29/023* (2013.01); *G01R 31/2851* (2013.01)
  USPC ...................................... 324/762.01; 324/537

(58) Field of Classification Search
  CPC ........................... G01R 29/023; G01R 31/2851
  USPC ............. 324/73.46, 73.47, 76.72, 158.1, 500, 324/537, 762.01; 327/17, 18, 21, 23, 27, 327/47, 48
  See application file for complete search history.

(56) References Cited

U.S. PATENT DOCUMENTS

| | | | |
|---|---|---|---|
| 3,663,828 A | 5/1972 | Low | |
| 3,818,402 A | 6/1974 | Golaski | |
| 4,163,944 A | 8/1979 | Chambers | |
| 4,245,355 A | 1/1981 | Pascoe | |
| 4,409,608 A | 10/1983 | Yoder | |
| 4,816,784 A | 3/1989 | Rabjohn | |
| 5,159,205 A | 10/1992 | Gorecki | |
| 5,208,725 A | 5/1993 | Akcasu | |
| 5,212,653 A | 5/1993 | Tanaka | |
| 5,406,447 A | 4/1995 | Miyazaki | |

(Continued)

OTHER PUBLICATIONS

Kuo-Hsing Cheng, Chang-Chien Hu, Jen-Chieh Liu and Hong-Yi Huang, A Time-to-Digital Converter Using Multi-Phase-Sampling and Time Amplifier for All Digital Phase-Locked Loop, Design and Diagnostics of Electronic Circuits and Systems (DDECS), 2010 IEEE 13th International Symposium on, p. 455-459, Website.

(Continued)

*Primary Examiner* — Jermele M Hollington
*Assistant Examiner* — Raul Rios Russo
(74) *Attorney, Agent, or Firm* — Ding Yu Tan

(57) ABSTRACT

A pulse width estimation method, applied between an integrated circuit and a circuit system for generating a reference pulse with a predetermined pulse width, includes steps for the following: generating an under-test pulse with an under-test pulse width by the integrated circuit; delivering the under-test and reference pulses to the integrated circuit for multiplying the under-test pulse width and the predetermined pulse width thereof by a timing gain and thereby obtaining a gained under-test pulse and a gained reference pulse, respectively; providing, by the integrated circuit, a count pulse for sampling the gained under-test pulse and the gained reference pulse and thereby obtaining a first count number and a second count number, respectively; and estimating the under-test pulse width by using the predetermined pulse width, the first count number and the second count number. A pulse width estimation device is also provided.

15 Claims, 7 Drawing Sheets

(56) References Cited

U.S. PATENT DOCUMENTS

| | | |
|---|---|---|
| 5,446,309 A | 8/1995 | Adachi |
| 5,583,359 A | 12/1996 | Ng |
| 5,637,900 A | 6/1997 | Ker |
| 5,760,456 A | 6/1998 | Grzegorek |
| 5,808,330 A | 9/1998 | Rostoker |
| 5,923,225 A | 7/1999 | De Los Santos |
| 5,959,820 A | 9/1999 | Ker |
| 6,008,102 A | 12/1999 | Alford |
| 6,008,655 A * | 12/1999 | Kuroda .................. 324/537 |
| 6,081,146 A | 6/2000 | Shiochi |
| 6,172,378 B1 | 1/2001 | Hull |
| 6,194,739 B1 | 2/2001 | Ivanov |
| 6,246,271 B1 | 6/2001 | Takada |
| 6,285,578 B1 | 9/2001 | Huang |
| 6,291,872 B1 | 9/2001 | Wang |
| 6,295,315 B1 | 9/2001 | Frisch |
| 6,370,372 B1 | 4/2002 | Molnar |
| 6,407,412 B1 | 6/2002 | Iniewski |
| 6,427,226 B1 | 7/2002 | Mallick |
| 6,448,858 B1 | 9/2002 | Helms |
| 6,452,442 B1 | 9/2002 | Laude |
| 6,456,221 B2 | 9/2002 | Low |
| 6,461,914 B1 | 10/2002 | Roberts |
| 6,480,137 B2 | 11/2002 | Kulkarni |
| 6,483,188 B1 | 11/2002 | Yue |
| 6,486,765 B1 | 11/2002 | Katayanagi |
| 6,509,805 B2 | 1/2003 | Ochiai |
| 6,518,165 B1 | 2/2003 | Yoon |
| 6,521,939 B1 | 2/2003 | Yeo |
| 6,545,547 B2 | 4/2003 | Fridi |
| 6,560,306 B1 | 5/2003 | Duffy |
| 6,588,002 B1 | 7/2003 | Lampaert |
| 6,593,838 B2 | 7/2003 | Yue |
| 6,603,360 B2 | 8/2003 | Kim |
| 6,608,363 B1 | 8/2003 | Fazelpour |
| 6,611,223 B2 | 8/2003 | Low |
| 6,625,077 B2 | 9/2003 | Chen |
| 6,630,897 B2 | 10/2003 | Low |
| 6,639,298 B2 | 10/2003 | Chaudhry |
| 6,653,868 B2 | 11/2003 | Oodaira |
| 6,668,358 B2 | 12/2003 | Friend |
| 6,700,771 B2 | 3/2004 | Bhattacharyya |
| 6,720,608 B2 | 4/2004 | Lee |
| 6,724,677 B1 | 4/2004 | Su |
| 6,756,656 B2 | 6/2004 | Lowther |
| 6,795,001 B2 | 9/2004 | Roza |
| 6,796,017 B2 | 9/2004 | Harding |
| 6,798,011 B2 | 9/2004 | Adan |
| 6,810,242 B2 | 10/2004 | Molnar |
| 6,822,282 B2 | 11/2004 | Randazzo |
| 6,822,312 B2 | 11/2004 | Sowlati |
| 6,833,756 B2 | 12/2004 | Ranganathan |
| 6,841,847 B2 | 1/2005 | Sia |
| 6,847,572 B2 | 1/2005 | Lee |
| 6,853,272 B1 | 2/2005 | Hughes |
| 6,876,056 B2 | 4/2005 | Tilmans |
| 6,885,534 B2 | 4/2005 | Ker |
| 6,901,126 B1 | 5/2005 | Gu |
| 6,905,889 B2 | 6/2005 | Lowther |
| 6,909,149 B2 | 6/2005 | Russ |
| 6,927,664 B2 | 8/2005 | Nakatani |
| 6,958,522 B2 | 10/2005 | Clevenger |
| 7,009,252 B2 | 3/2006 | Lin |
| 7,027,276 B2 | 4/2006 | Chen |
| 7,205,612 B2 | 4/2007 | Cai |
| 7,262,069 B2 | 8/2007 | Chung |
| 7,365,627 B2 | 4/2008 | Yen |
| 7,368,761 B1 | 5/2008 | Lai |
| 7,405,642 B1 | 7/2008 | Hsu |
| 7,439,724 B2 | 10/2008 | Heidel |
| 7,672,100 B2 | 3/2010 | Van Camp |
| 8,253,463 B1 * | 8/2012 | Chromczak et al. .......... 327/176 |
| 2002/0019123 A1 | 2/2002 | Ma |
| 2002/0036545 A1 | 3/2002 | Fridi |
| 2002/0188920 A1 | 12/2002 | Lampaert |
| 2003/0076636 A1 | 4/2003 | Ker |
| 2003/0127691 A1 | 7/2003 | Yue |
| 2003/0183403 A1 | 10/2003 | Kluge |
| 2005/0068112 A1 | 3/2005 | Glenn |
| 2005/0068113 A1 | 3/2005 | Glenn |
| 2005/0087787 A1 | 4/2005 | Ando |
| 2006/0006431 A1 | 1/2006 | Jean |
| 2006/0108694 A1 | 5/2006 | Hung |
| 2006/0267102 A1 | 11/2006 | Cheng |
| 2007/0102745 A1 | 5/2007 | Hsu |
| 2007/0210416 A1 | 9/2007 | Hsu |
| 2007/0234554 A1 | 10/2007 | Hung |
| 2007/0246801 A1 | 10/2007 | Hung |
| 2007/0249294 A1 | 10/2007 | Wu |
| 2007/0296055 A1 | 12/2007 | Yen |
| 2008/0094166 A1 | 4/2008 | Hsu |
| 2008/0185679 A1 | 8/2008 | Hsu |
| 2008/0189662 A1 | 8/2008 | Nandy |
| 2008/0200132 A1 | 8/2008 | Hsu |
| 2008/0201099 A1 * | 8/2008 | Suda et al. ............... 702/118 |
| 2008/0299738 A1 | 12/2008 | Hsu |
| 2008/0303623 A1 | 12/2008 | Hsu |
| 2009/0029324 A1 | 1/2009 | Clark |
| 2009/0201625 A1 | 8/2009 | Liao |
| 2010/0279484 A1 | 11/2010 | Wang |

OTHER PUBLICATIONS

Minjae Lee, Mohammad E. Heidari, and Asad A. Abidi, A Low-Noise Wideband Digital Phase-Locked Loop Based on a Coarse-Fine Time-to-Digital Converter With Subpicosecond Resolution, IEEE Journal of Solid-State Circuits, vol. 44, Issue 10, Oct. 2009, p. 2808-2816, Journals & Magazines.

Tetsutaro Hashimoto, Hirotaka Yamazaki, Atsushi Muramatsu, Tornio Sato and Atsuki Inoue, Time-to-Digital Converter with Vernier Delay Mismatch Compensation for High Resolution On-Die Clock Jitter Measurement, VLSI Circuits, 2008 IEEE Symposium on, Jun. 18-20, 2008, p. 166-167, Website.

Jianjun Yu and Fa Foster Dai, On-chip Jitter Measurement Using Vernier Ring Time-to-digital Converter, Dec. 1-4, 2010, Test Symposium (ATS), 2010 19th IEEE Asian, p. 167-170, Website.

Saleh M. Abdel-Hafeez, Shadi M. Harb, and Ken M. Lee, On-chip jitter measurement architecture using a delay-locked loop with vernier delay line, to the order of giga hertz, Jun. 16-18, 2011, p. 502-506, Mixed Design of Integrated Circuits and Systems (MIXDES), 2011 Proceedings of the 18th International Conference, Website.

* cited by examiner

METHOD AND DEVICE FOR PULSE WIDTH ESTIMATION

FIELD OF THE INVENTION

The present invention relates to method and device for pulse width estimation, and more particularly to method and device for pulse width estimation with a higher accuracy.

BACKGROUND OF THE INVENTION

Basically, the reading and writing in a memory unit of an integrated circuit are processed based on stable and accurate pulses. Conventionally, the measurement of the pulse width of a pulse is realized by an on-chip jitter measurement unit as illustrated in FIG. 1. As shown, first, the leading signal and the lagging signal, represented as the rising edge and the falling edge of an under-test pulse, are inputted to a first input end 111 and a second input end 112 of the on-chip jitter measurement unit, respectively. Specifically, the leading signal and the lagging signal, inputted to the first input end 111 and the second input end 112, are sequentially processed by a plurality of inverters 121~12N with a delay time Ts and a plurality of inverters 131~13N with a delay time Tf and thereby corporately triggering a plurality of D flip-flops 141~14N, respectively; wherein Ts is greater than Tf. Thus, the under-test time difference between the leading signal and the lagging signal decreases with the number of inverter; and eventually the pulse width of the under-test pulse is measured based on the digital code, represented as the time difference between the leading signal and the lagging signal and obtained by an encoder 15, when the time difference between the leading signal and the lagging signal as well as the outputs of the D flip-flops 141~14N are converted from a positive value into a negative value. However, due to the manufacture process, voltage and temperature variations, the conventional means for the on-chip jitter measurement unit as described above may not accurately measure the pulse width if the frequency of the under-test pulse increases to a specific level. Even when some other existing or conventional technical means, such as using the timing amplifier to extend the pulse width of the pulse, are introduced for accurately measuring the decreasing the pulse width, the uncertainty resulted from the manufacture process, voltage and temperature variations still cannot be eliminated effectively.

SUMMARY OF THE INVENTION

An embodiment of the present invention provides a pulse width estimation method applied between an integrated circuit and a circuit system. The circuit system is configured to generate a reference pulse with a predetermined pulse width. The pulse width estimation method includes steps of: generating, by the integrated circuit, an under-test pulse with an under-test pulse width; delivering the under-test pulse and the reference pulse to the integrated circuit for multiplying the under-test pulse width of the under-test pulse and the predetermined pulse width of the reference pulse by a timing gain and thereby obtaining a gained under-test pulse and a gained reference pulse, respectively; providing, by the integrated circuit, a count pulse for sampling the gained under-test pulse and the gained reference pulse and thereby obtaining a first count number and a second count number, respectively; and estimating the under-test pulse width by using the predetermined pulse width, the first count number and the second count number.

Another embodiment of the present invention provides a pulse width estimation device in an integrated circuit. The integrated circuit is configured to receive a reference pulse generated by an external circuit system. The reference pulse has a predetermined pulse width. The pulse width estimation device includes an under-test pulse generator, a processing unit, a count pulse generator and a counting unit. The under-test pulse generator is configured to generate an under-test pulse with an under-test pulse width. The processing unit, in communication with the under-test pulse generator and the circuit system, is configured to receive the under-test pulse and the reference pulse, multiply the under-test pulse width of the under-test pulse and the predetermined pulse width of the reference pulse by a timing gain and thereby obtaining a gained under-test pulse and a gained reference pulse, respectively. The count pulse generator is configured to generate a count pulse. The counting unit, in communication with the processing unit and the count pulse generator, is configured to sample the gained under-test pulse and the gained reference pulse by using the count pulse and thereby obtaining a first count number and a second count number, respectively, for estimating the under-test pulse width.

Another embodiment of the present invention provides a pulse width estimation device arranged in an integrated circuit. The integrated circuit is configured to receive a reference pulse generated by an external circuit system. The reference pulse has a predetermined pulse width. The pulse width estimation device includes an under-test pulse generator, a processing unit, a count pulse generator and a counting unit. The under-test pulse generator is configured to generate an under-test pulse with an under-test pulse width. The processing unit, in communication with the under-test pulse generator and the circuit system, is configured to receive the under-test pulse and the reference pulse, multiply the under-test pulse width of the under-test pulse and the predetermined pulse width of the reference pulse by a timing gain and thereby obtaining a gained under-test pulse and a gained reference pulse, respectively. The count pulse generator is configured to generate a count pulse. The counting unit, in communication with the processing unit and the count pulse generator, is configured to sample the gained under-test pulse and the gained reference pulse by using the count pulse and thereby obtaining a first count number and a second count number, respectively, and transmit the first count number and the second count number to the circuit system, wherein the circuit system is configured to calculate the under-test pulse width by using the predetermined pulse width, the first count number and the second count number.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
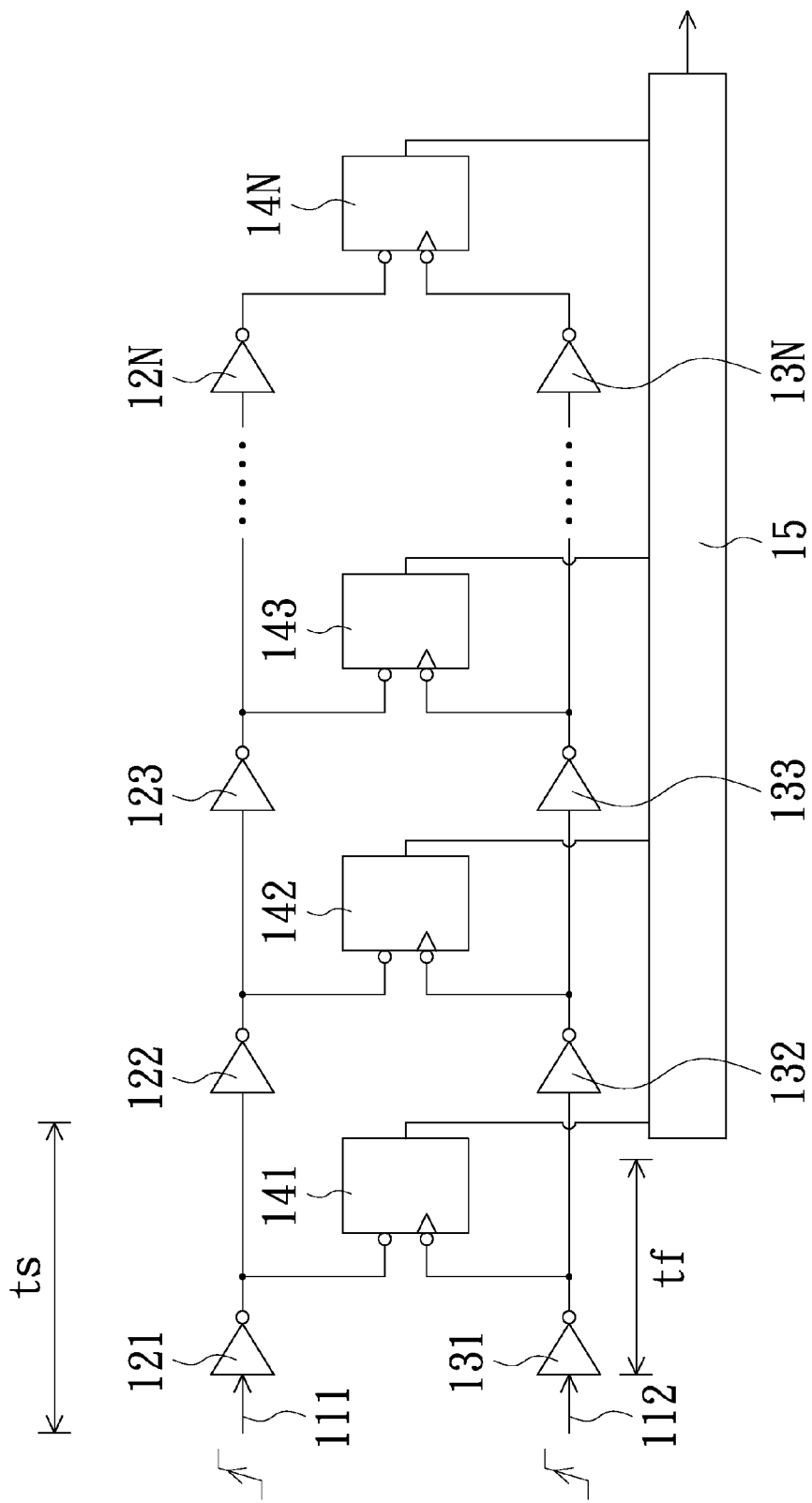
FIG. 1 is a schematic view of a conventional on-chip jitter measurement unit.
Figure 2A:
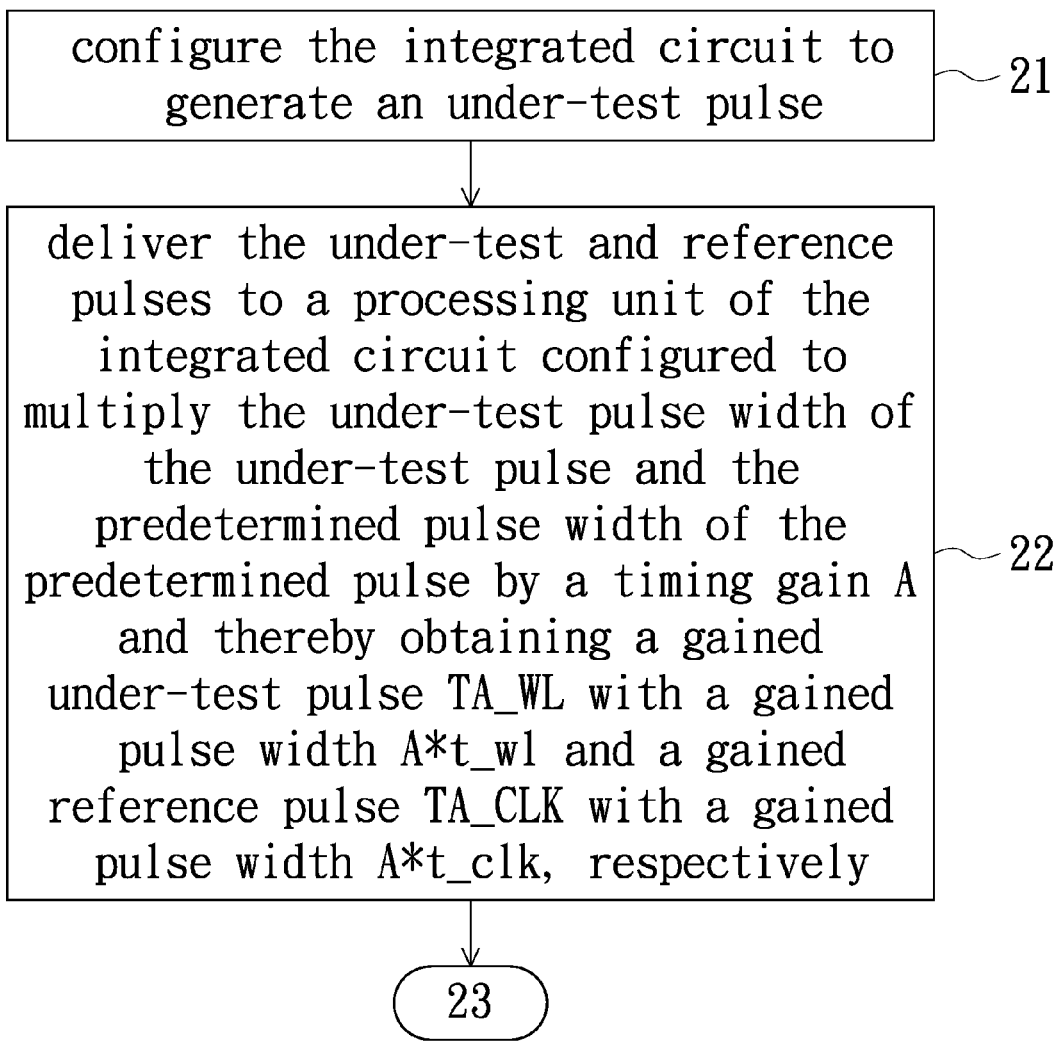
FIGS. 2A~2B are flow charts schematically illustrating an pulse width estimation method in accordance with an embodiment of the present invention.
Figure 2B:
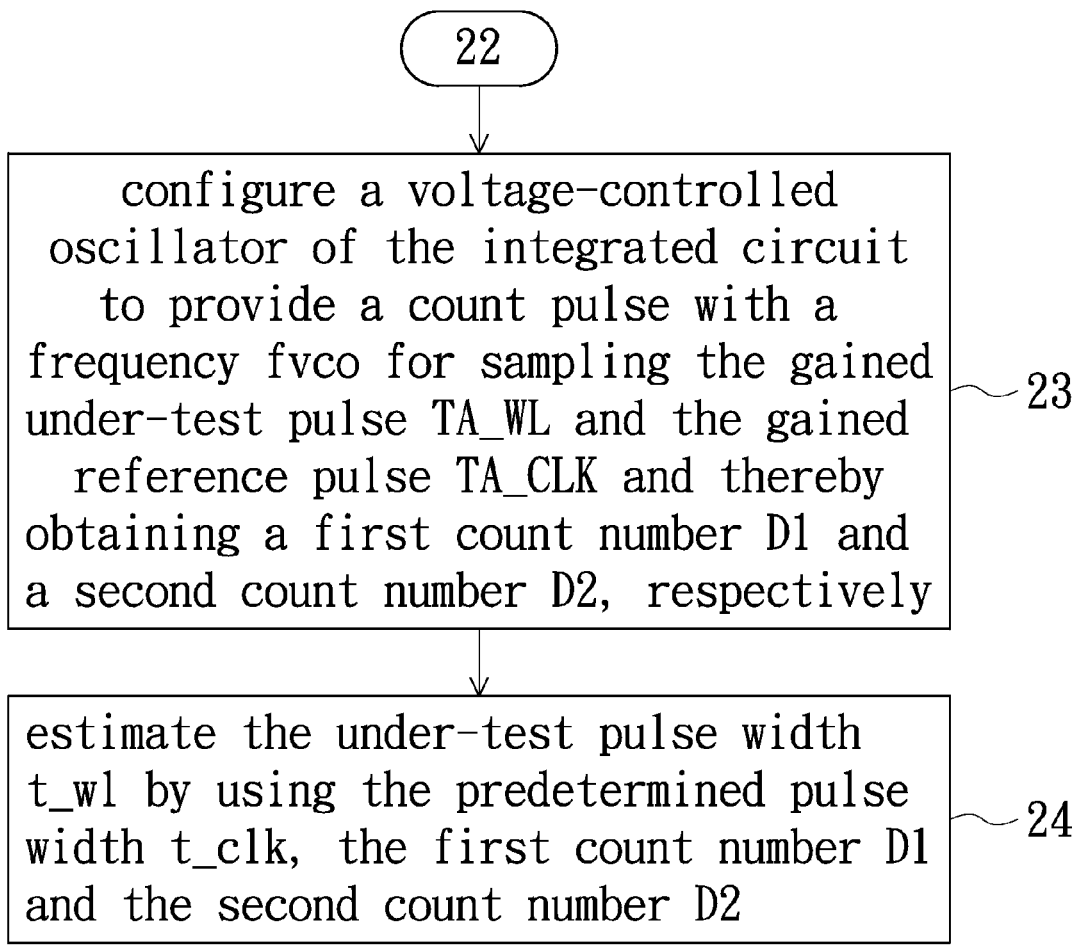

FIGS. 2A~2B are flow charts schematically illustrating a pulse width estimation method in accordance with an embodiment of the present invention; wherein the pulse width estimation method in this embodiment is primarily applied between an under-test integrated circuit and a circuit system in communication with the under-test integrated circuit. The circuit system is configured to generate a reference pulse with a predetermined pulse width t_clk. To facilitate to maintain the stability of the predetermined pulse width t_clk, the reference pulse may be generated by a crystal oscillator; and the present invention is not limited thereto. The pulse width estimation method includes steps as follow.

First, the integrated circuit is configured to generate an under-test pulse (step 21). The under-test pulse herein is, for example, a word line pulse used in a memory unit and configured to have an under-test pulse width t_wl thereof, for example, smaller, equal to or greater than the predetermined pulse width t_clk. Next, the under-test pulse and the reference pulse are delivered to a processing unit of the integrated circuit configured to multiply the under-test pulse width of the under-test pulse and the predetermined pulse width of the reference pulse by a timing gain A and thereby obtaining a gained under-test pulse TA_WL with a gained pulse width A*t_wl and a gained reference pulse TA_CLK with a gained pulse width A*t_clk, respectively (step 22). Next, a voltage-controlled oscillator of the integrated circuit is configured to provide a count pulse with a frequency fvco for sampling the gained under-test pulse TA_WL and the gained reference pulse TA_CLK and thereby obtaining a first count number D1 and a second count number D2, respectively (step 23). Then, the under-test pulse width t_wl is estimated by using the predetermined pulse width t_clk, the first count number D1 and the second count number D2 based on the following equations:

$$D1 = A*t\_wl*fvco, \quad [1]$$

$$D2 = A*t\_clk*fvco, \quad [2]$$

$$D1/D2 = (A*t\_wl*fvco)/(A*t\_clk*fvco) \quad [3]$$

It is to be noted that the frequency fvco of the count pulse is greater than the frequencies of the gained under-test pulse TA_WL and the gained reference pulse TA_CLK.

According to the equations [1]~[3], namely, D1=A*t_wl*fvco, D2=A*t_clk*fvco, D1/D2=(A*t_wl*fvco)/(A*t_clk*fvco), it is to be noted that the impact of the variations of the timing gain A and the count pulse frequency fvco, resulted from the manufacturing process, voltage or temperature variations, on the estimation of the under-test pulse width t_wl can be effectively eliminated due to having both of the processing unit, configured to provide timing gain A, and the voltage-controlled oscillator in the present invention manufactured into the same integrated circuit chip by the same integrated circuit manufacturing process.

Figure 3:
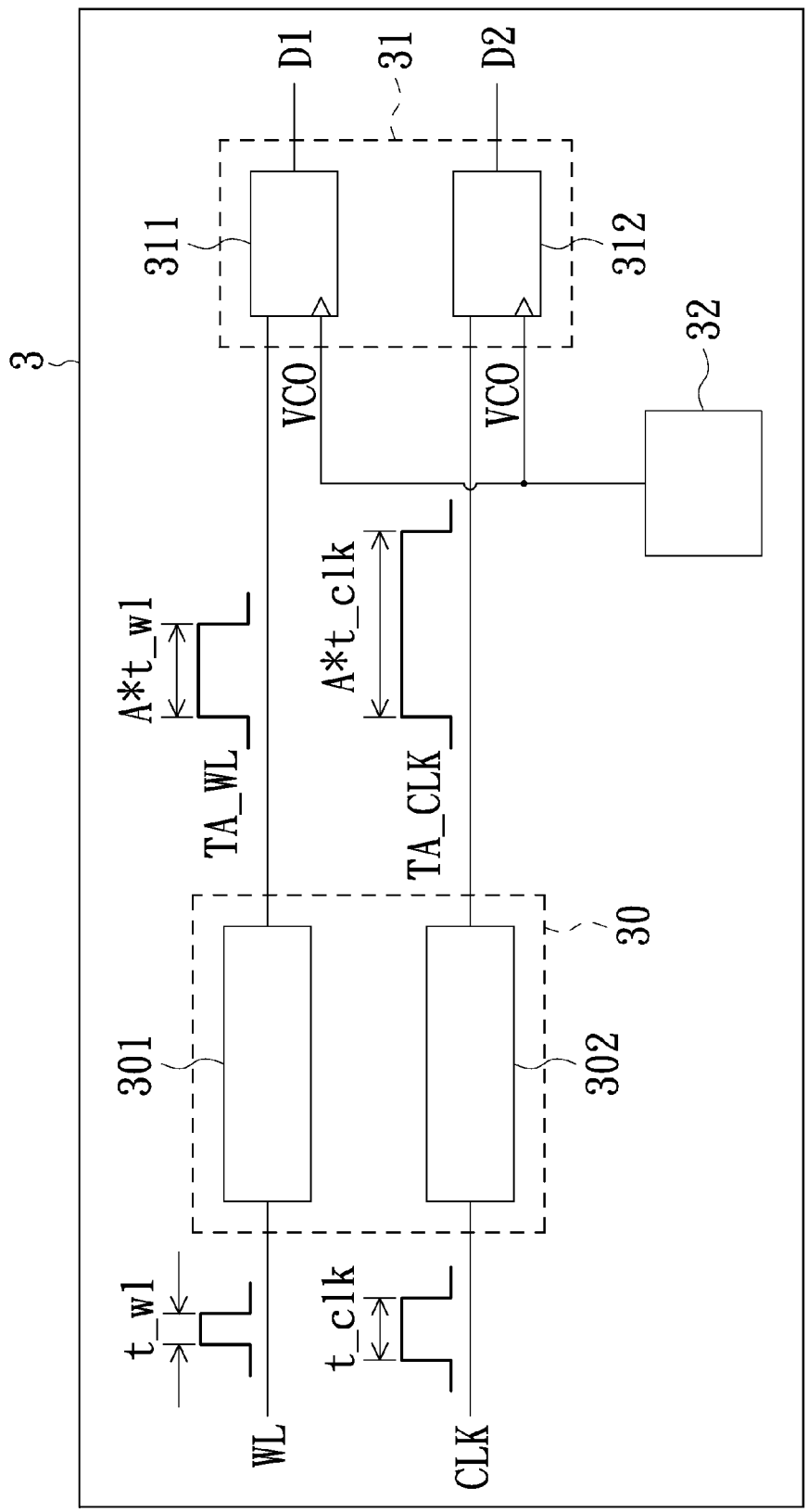
FIG. 3 is a pulse width estimation device in accordance with the first embodiment of the present invention.

FIG. 3 is a pulse width estimation device in accordance with a first embodiment of the present invention. In this embodiment, specifically, the under-test pulse WL with the under-test pulse width t_wl and the reference pulse CLK with the predetermined pulse width t_clk are inputted to a processing unit 30 in an integrated circuit chip 3. The processing unit 30 mainly includes two timing amplifiers 301, 302, which are configured to receive the under-test pulse WL and the reference pulse CLK, multiply the under-test pulse width t_wl of the under-test pulse WL and the predetermined pulse width t_clk of the reference pulse CLK by a timing gain A and thereby obtaining a gained under-test pulse TA_WL with a pulse width A*t_wl and a gained reference pulse TA_CLK with a pulse width A*t_clk, and transmitting the gained under-test pulse TA_WL and the gained reference pulse TA_CLK to a counting unit 31, respectively. The counting unit 31 includes two counters 311, 312, which are configured to sample the gained under-test pulse TA_WL and the gained reference pulse TA_CLK by using the count pulse VCO generated by a count pulse generator 32 and thereby obtaining a first count number D1 and a second count number D2, respectively, for estimating the under-test pulse width t_wl. In one embodiment, the under-test pulse width t_wl is estimated by the following equation:

$$t\_wl = (D1/D2)*t\_clk. \quad [4]$$

Specifically, the timing amplifiers 301, 302, the count pulse generator 32 and the counters 311, 312 are manufactured into the same integrated circuit chip 3 by the same integrated circuit manufacturing process; thus, the impact of the variations of the timing gain A and the count pulse frequency fvco on the estimation of the under-test pulse width t_wl can be effectively eliminated.

Figure 4:
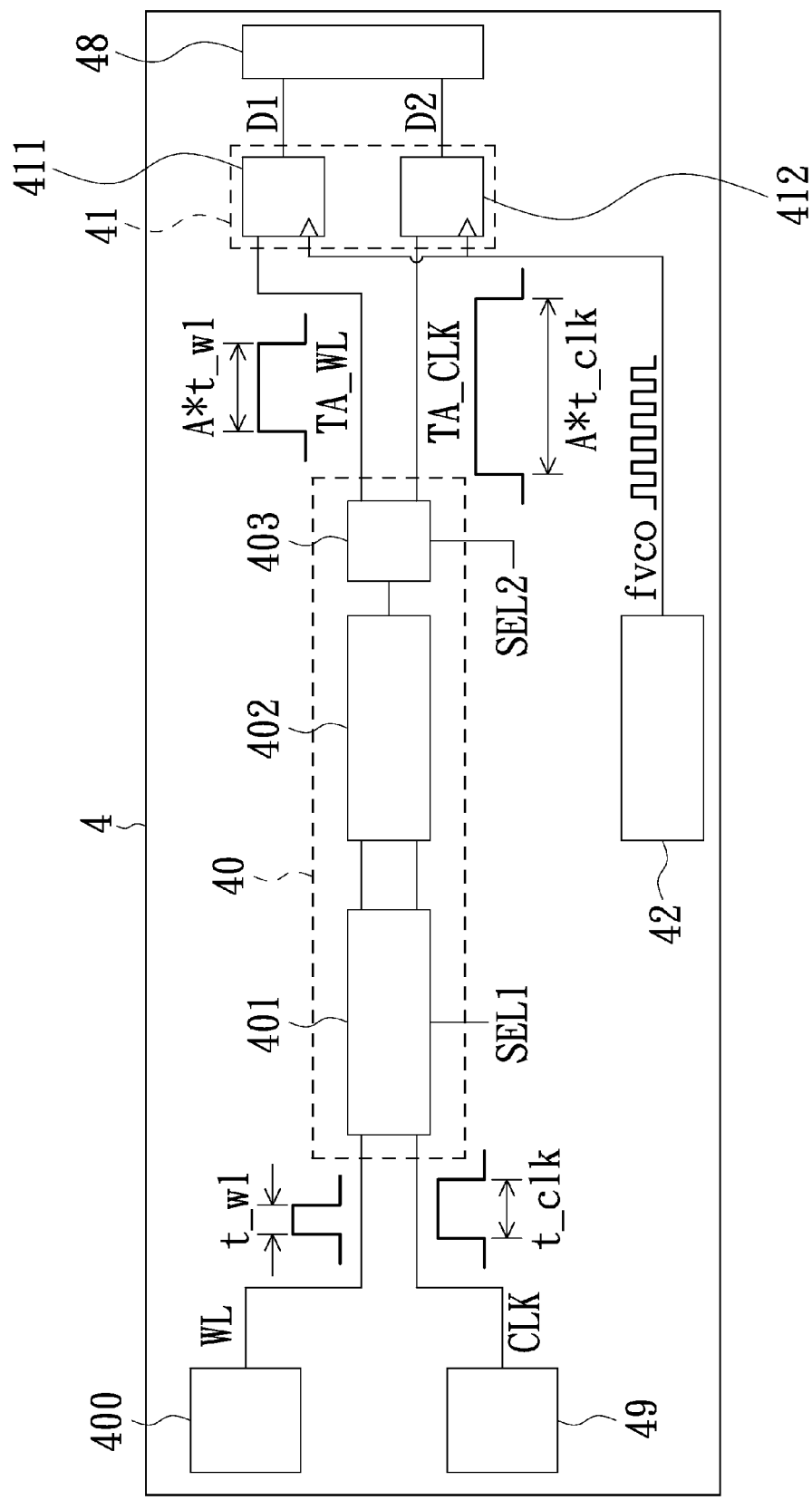
FIG. 4 is a pulse width estimation device in accordance with the second embodiment of the present invention.

FIG. 4 is a pulse width estimation device in accordance with a second embodiment of the present invention. In this embodiment, specifically, the under-test pulse WL is generated by an under-test pulse generator 400; the reference pulse CLK is generated by a crystal oscillator 49; the under-test pulse WL and the reference pulse CLK are inputted to a processing unit 40 in the integrated circuit chip 4; and the under-test pulse width t_wl of the under-test pulse WL is, for example, smaller than the predetermined pulse width t_clk of the reference pulse CLK.

The processing unit 40 mainly includes a time difference generator 401 and a timing amplifier 402. The time difference generator 401, in communication with the under-test pulse generator 400 and the crystal oscillator 49, is configured to receive the under-test pulse WL and the reference pulse CLK, and process, by a controlling of an end SEL1 thereof, a first rising edge and a first falling edge of the under-test pulse WL into a first rising edge trigger signal and a second rising edge trigger signal, respectively, in a first period and a second rising edge and a second falling edge of the reference pulse CLK into a third rising edge trigger signal and a fourth rising edge trigger signal, respectively, in a second period. The timing amplifier 402 is configured to generate the gained under-test pulse TA_WL by receiving the first rising edge trigger signal and the second rising edge trigger signal in the first period and generate the gained reference pulse TA_CLK by receiving the third rising edge trigger signal and the fourth rising edge trigger signal in the second period. The gained under-test pulse TA_WL and the gained reference pulse TA_CLK are then transmitted to a demultiplexer 403, which is configured to output the gained under-test pulse TA_WL and the gained reference pulse TA_CLK to a counting unit 41 via a controlling of an end SEL2 thereof. The counting unit 41 includes two counters 411, 412, which are configured to sample the gained under-test pulse TA_WL and the gained reference pulse TA_CLK by using the count pulse VCO with a frequency fvco generated by a count pulse generator 42 and thereby obtaining the first count number D1 and the second count number D2, respectively, for estimating the under-test pulse width t_wl. In one embodiment, the under-test pulse width t_wl is estimated by equation [4], which is as follow: t_wl=(D1/D2)*t_clk; where the equation t_wl=(D1/D2)*t_clk is realized by a calculation unit 48, which may be implemented by way of hardware, software or firmware in either the integrated circuit chip 4 or an external circuit system. Based on the same manner, the time difference generator 401, the timing amplifier 402, the count pulse generator 42 and the counters 411, 412 are manufactured into the same integrated circuit chip 4 by a same integrated circuit manufacturing process; thus, the impact of the variations of the timing gain A and the count pulse frequency fvco on the estimation of the under-test pulse width t_wl can be effectively eliminated.

Figure 5:
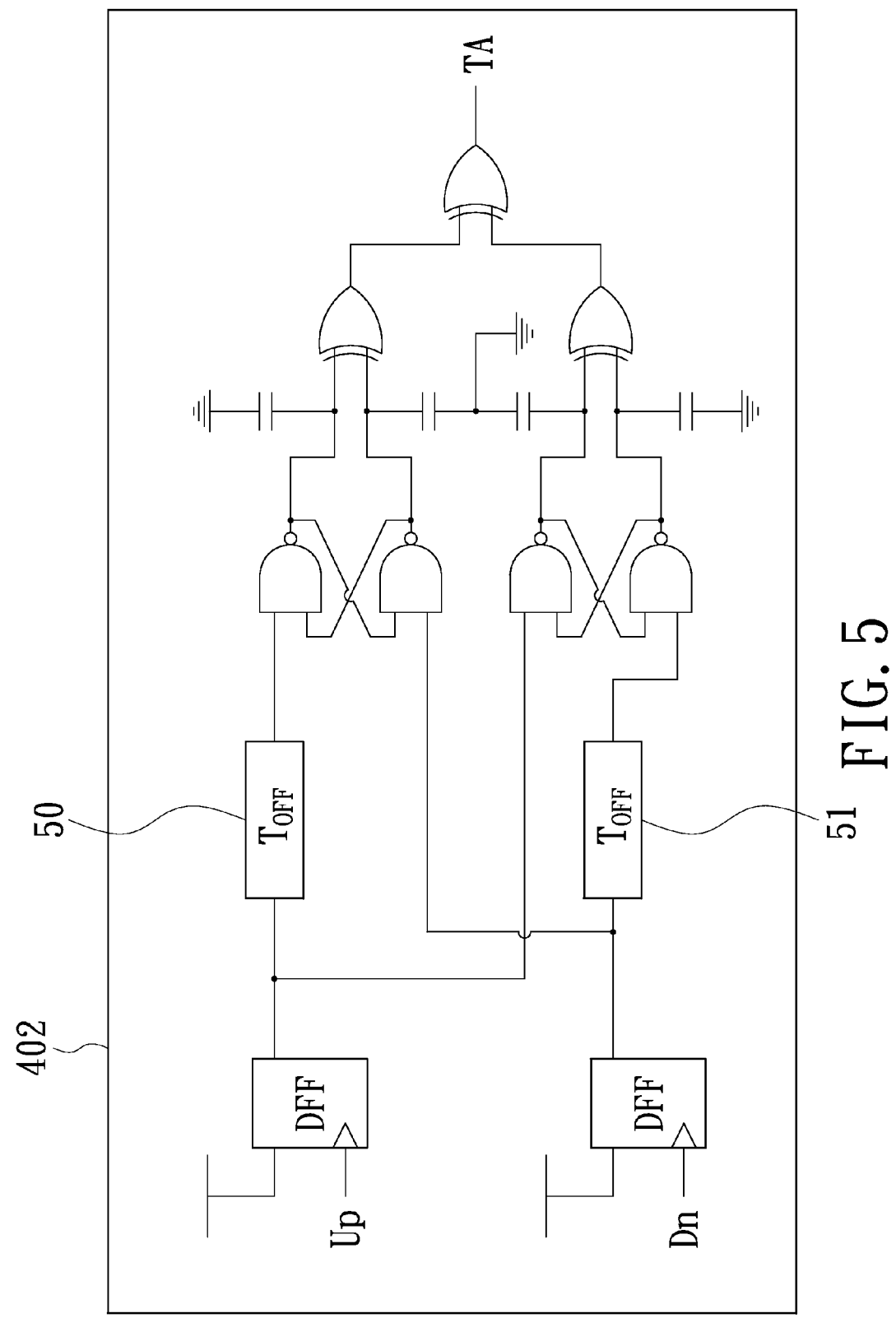
FIG. 5 is a schematic circuit view of the timing amplifiers shown in FIGS. 3 and 4.
Figure 6:
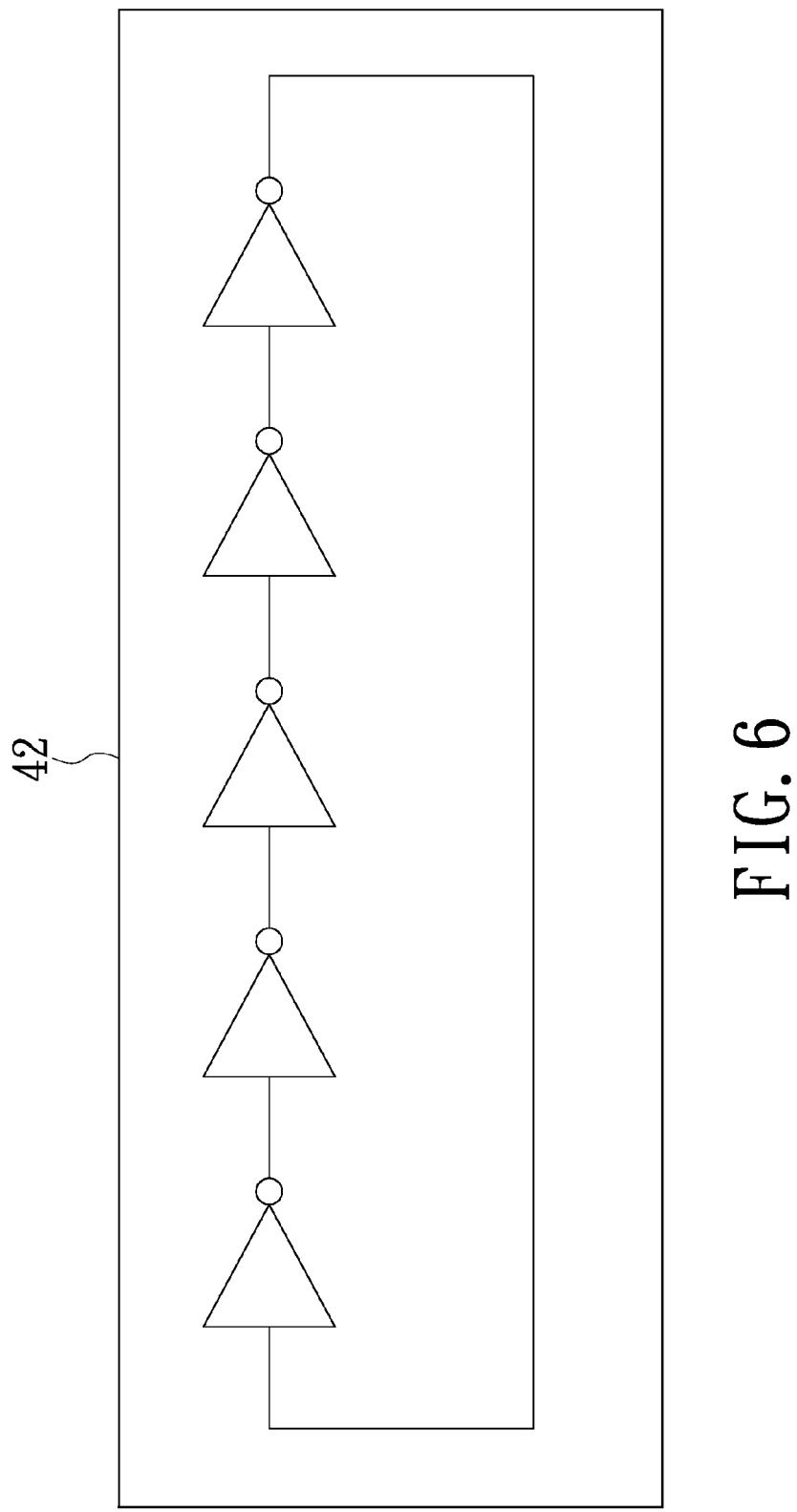
FIG. 6 is a schematic circuit view of a ring oscillator.

FIG. 5 is a schematic internal circuit view of the timing amplifiers 301, 302 or 402. As shown, any one of the timing amplifiers 301, 302 or 402 includes a plurality of D-type flip-flops, NAND gates and XOR gates. The timing gain A is primarily determined by 2C/(gm*Toff); wherein C is the output capacitance of the NAND gate, gm is the transconductance of the XOR gate, and Toff is the time offset provided by the delay chains 50, 51. In addition, the count pulse generator 42 may be realized by a ring oscillator as shown in FIG. 6 or other types of voltage-controlled oscillators, and the present invention is not limited thereto. Furthermore, the under-test pulse generator may be a word line pulse generator applied in a memory unit, and the present invention is not limited thereto. In addition, it is understood that the connections among the processing unit, the under-test pulse generator, the circuit system, the counting unit, the count pulse generator, the time difference generator and the timing amplifier may be realized by electric connection, wireless communication or optical communication manners; and the present invention is not limited thereto.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A pulse width estimation method applied between an integrated circuit and a circuit system, the circuit system being configured to generate a reference pulse with a predetermined pulse width, the pulse width estimation method comprising steps of:
   generating an under-test pulse with an under-test pulse width by the integrated circuit;
   delivering the under-test pulse and the reference pulse to the integrated circuit for multiplying the under-test pulse width of the under-test pulse and the predetermined pulse width of the reference pulse by a timing gain and thereby obtaining a gained under-test pulse and a gained reference pulse, respectively;
   providing a count pulse for sampling the gained under-test pulse and the gained reference pulse by the integrated circuit, and thereby obtaining a first count number and a second count number, respectively; and
   estimating the under-test pulse width by using the predetermined pulse width, the first count number and the second count number.

2. The pulse width estimation method according to claim 1, wherein the reference pulse is generated by a crystal oscillator, and the under-test pulse is a word line pulse applied in a memory unit.

3. The pulse width estimation method according to claim 1, wherein the step of multiplying the under-test pulse width of the under-test pulse and the predetermined pulse width of the reference pulse by the timing gain and thereby obtaining the gained under-test pulse and the gained reference pulse, respectively, is realized by a processing unit of the integrated circuit.

4. The pulse width estimation method according to claim 3, wherein the processing unit and a voltage-controlled oscillator configured to provide the count pulse are manufactured into a same integrated circuit chip by a same integrated circuit manufacturing process.

5. The pulse width estimation method according to claim 1, wherein the under-test pulse width is t_wl, the predetermined pulse width is t_clk, the first count number is D1, the second count number is D2, and t_wl=(D1/D2)*t_clk.

6. A pulse width estimation device in an integrated circuit, the integrated circuit being configured to receive a reference pulse generated by an external circuit system, the reference pulse having a predetermined pulse width, the pulse width estimation device comprising:
   an under-test pulse generator configured to generate an under-test pulse with an under-test pulse width;
   a processing unit, in communication with the under-test pulse generator and the circuit system, configured to receive the under-test pulse and the reference pulse, multiply the under-test pulse width of the under-test pulse and the predetermined pulse width of the reference pulse by a timing gain and thereby obtaining a gained under-test pulse and a gained reference pulse, respectively;
   a count pulse generator configured to generate a count pulse; and
   a counting unit, in communication with the processing unit and the count pulse generator, configured to sample the gained under-test pulse and the gained reference pulse by using the count pulse and thereby obtaining a first count number and a second count number, respectively, for estimating the under-test pulse width.

7. The pulse width estimation device according to claim 6, wherein the processing unit comprises:
   a time difference generator, in communication with the under-test pulse generator and the circuit system, configured to receive the under-test pulse and the reference pulse, and process a first rising edge and a first falling edge of the under-test pulse and a second rising edge and a second falling edge of the reference pulse into a first rising edge trigger signal, a second rising edge trigger signal, a third rising edge trigger signal and a fourth rising edge trigger signal, respectively; and
   a timing amplifier, in communication with the time difference generator, configured to generate the gained under-test pulse by receiving the first rising edge trigger signal and the second rising edge trigger signal and generate the gained reference pulse by receiving the third rising edge trigger signal and the fourth rising edge trigger signal.

8. The pulse width estimation device according to claim 6, wherein the under-test pulse generator is a word line pulse generator applied in a memory unit, the reference pulse is generated by a crystal oscillator, and the count pulse generator is a voltage-controlled oscillator.

9. The pulse width estimation device according to claim 6, wherein the under-test pulse generator, the processing unit, the count pulse generator and the counting unit are manufactured into a same integrated circuit chip by a same integrated circuit manufacturing process.

10. The pulse width estimation device according to claim 6, further comprising a calculation unit, in communication with the counting unit, configured to calculate the under-test pulse width by using an equation $t\_wl=(D1/D2)*t\_clk$, wherein $t\_wl$ is the under-test pulse width, $t\_clk$ is the predetermined pulse width, D1 is the first count number and D2 is the second count number.

11. A pulse width estimation device arranged in an integrated circuit, the integrated circuit being configured to receive a reference pulse generated by an external circuit system, the reference pulse having a predetermined pulse width, the pulse width estimation device comprising:
an under-test pulse generator configured to generate an under-test pulse with an under-test pulse width;
a processing unit, in communication with the under-test pulse generator and the external circuit system, configured to receive the under-test pulse and the reference pulse, multiply the under-test pulse width of the under-test pulse and the predetermined pulse width of the reference pulse by a timing gain and thereby obtaining a gained under-test pulse and a gained reference pulse, respectively;
a count pulse generator configured to generate a count pulse; and
a counting unit, in communication with the processing unit and the count pulse generator, configured to sample the gained under-test pulse and the gained reference pulse by using the count pulse and thereby obtaining a first count number and a second count number, respectively, and transmit the first count number and the second count number to the circuit system, wherein the circuit system is configured to calculate the under-test pulse width by using the predetermined pulse width, the first count number and the second count number.

12. The pulse width estimation device according to claim 11, wherein the processing unit comprises:
a time difference generator, in communication with the under-test pulse generator and the circuit system, configured to receive the under-test pulse and the reference pulse, and process a first rising edge and a first falling edge of the under-test pulse and a second rising edge and a second falling edge of the reference pulse into a first rising edge trigger signal, a second rising edge trigger signal, a third rising edge trigger signal and a fourth rising edge trigger signal, respectively; and
a timing amplifier, in communication with the time difference generator, configured to generate the gained under-test pulse by receiving the first rising edge trigger signal and the second rising edge trigger signal and generate the gained reference pulse by receiving the third rising edge trigger signal and the fourth rising edge trigger signal.

13. The pulse width estimation device according to claim 11, wherein the under-test pulse generator is a word line pulse generator applied in a memory unit, the reference pulse is generated by a crystal oscillator, and the count pulse generator is a voltage-controlled oscillator.

14. The pulse width estimation device according to claim 11, wherein the under-test pulse generator, the processing unit, the count pulse generator and the counting unit are manufactured into a same integrated circuit chip by a same integrated circuit manufacturing process.

15. The pulse width estimation device according to claim 11, wherein the circuit system comprises a calculation unit, in communication with to the counting unit, configured to calculate the under-test pulse width by using an equation $t\_wl=(D1/D2)*t\_clk$, wherein $t\_wl$ is the under-test pulse width, $t\_clk$ is the predetermined pulse width, D1 is the first count number and D2 is the second count number.

\* \* \* \* \*